(12) United States Patent
Lallement et al.

(10) Patent No.: US 11,569,132 B2
(45) Date of Patent: Jan. 31, 2023

(54) TRANSISTOR STRUCTURE WITH N/P BOUNDARY BUFFER

(71) Applicant: International Business Machines Corporation, Armonk, NY (US)

(72) Inventors: Romain Lallement, Troy, NY (US); Indira Seshadri, Niskayuna, NY (US); Ruqiang Bao, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 17/138,834

(22) Filed: Dec. 30, 2020

(65) Prior Publication Data

US 2021/0118743 A1 Apr. 22, 2021

Related U.S. Application Data

(62) Division of application No. 16/399,864, filed on Apr. 30, 2019, now Pat. No. 10,903,124.

(51) Int. Cl.
| | |
|---|---|
| *H01L 21/8234* | (2006.01) |
| *H01L 21/28* | (2006.01) |
| *H01L 21/02* | (2006.01) |
| *H01L 29/06* | (2006.01) |
| *H01L 27/092* | (2006.01) |

(52) U.S. Cl.
CPC ........ *H01L 21/823468* (2013.01); *H01L 21/02587* (2013.01); *H01L 21/28123* (2013.01); *H01L 27/0924* (2013.01); *H01L 29/0653* (2013.01); *H01L 29/0665* (2013.01)

(58) Field of Classification Search
CPC ....... H01L 21/823468; H01L 21/02587; H01L 21/28123; H01L 27/0924; H01L 29/0653; H01L 29/0665; H01L 21/823828; H01L 21/823878; H01L 27/092; H01L 29/0673; H01L 29/42392; H01L 29/66439; H01L 29/775; H01L 29/78696; B82Y 10/00

See application file for complete search history.

(56) References Cited

U.S. PATENT DOCUMENTS

| | | | |
|---|---|---|---|
| 8,476,168 | B2 | 7/2013 | Graves-Abe et al. |
| 9,831,324 | B1 | 11/2017 | Chao et al. |
| 9,984,940 | B1 | 5/2018 | Chu et al. |
| 2017/0330801 | A1 | 11/2017 | Ragnarsson et al. |
| 2018/0047853 | A1 | 2/2018 | Chang et al. |
| 2020/0350212 | A1 | 11/2020 | Lallement et al. |

OTHER PUBLICATIONS

Dual step PG recess for Beyond-7nm Nanosheet nFET Rmg, IP.com Disclosure No. IPCOM000254276D, Jun. 15, 2018, pp. 1-6.
Paul J. Otterstedt, List of IBM Patents or Patent Applications Treated as Related, Dec. 30, 2020, pp. 1-2.

*Primary Examiner* — Robert G Bachner
(74) *Attorney, Agent, or Firm* — Abdy Raissinia; Otterstedt & Kammer PLLC (57) ABSTRACT

Gate metal is removed from a region containing transistors such as nanosheet transistors or vertical transport field-effect transistors using techniques that control the undercutting of gate metal in an adjoining region. A dielectric spacer layer is deposited on the transistors. A first etch causes the removal of gate metal over the boundary between the regions with limited undercutting of gate metal beneath the dielectric spacer layer. A subsequent etch removes the gate metal from the transistors in one region while the gate metal in the adjoining region is protected by a buffer layer. Gate dielectric material may also be removed over the boundary between regions.

7 Claims, 10 Drawing Sheets

FIG. 1D n/p BOUNDARY
FIG. 1E n/p BOUNDARY
FIG. 1F

FIG. 2A

FIG. 2B n/p BOUNDARY
FIG. 2C n/p BOUNDARY
FIG. 2D

FIG. 2E

FIG. 2F n/p BOUNDARY
FIG. 3A n/p BOUNDARY
FIG. 3B

TRANSISTOR STRUCTURE WITH N/P BOUNDARY BUFFER

CROSS-REFERENCE TO RELATED APPLICATION

This application is a division of U.S. patent application Ser. No. 16/399,864 filed Apr. 30, 2019, the complete disclosure of which is expressly incorporated herein by reference in its entirety for all purposes.

BACKGROUND

The present invention relates generally to the electrical, electronic and computer arts and, more particularly, to methods for removing work function metal from arrays of transistor devices during a replacement metal gate process and structures obtained from the methods.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

FinFET, nanosheet and vertical transport FETs have been under development for possible use in tight pitch applications. Nanosheet FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs. Spacers are employed for electrically isolating the gates from the source/drain regions of nanosheet transistors. Vertical transport field-effect transistors (VTFETs) have configurations wherein the current between the drain and source regions is substantially normal to the surface of the die. A vertical transport field-effect transistor may, for example, include a semiconductor pillar or fin having top and bottom regions comprising source/drain regions, the portion of the pillar between the source/drain regions defining a channel region.

BRIEF SUMMARY

An exemplary method of removing gate metal from a region of field-effect transistors includes obtaining a monolithic structure including first and second regions, the first region including a first field-effect transistor structure, the second region including a second field-effect transistor structure. A trench between the first and second field-effect transistor structures extends over a boundary between the first region and the second region. A layer of gate dielectric material extends between the first and second field-effect transistor structures and across the trench and a layer of gate metal extends over channel regions of the first and second field-effect transistor structures and over the layer of gate dielectric material. A dielectric spacer layer is deposited over the monolithic structure. The dielectric spacer layer extends over the first and second field-effect transistor structures and has a horizontal segment extending across a bottom surface of the trench. At least a portion of the horizontal segment of the dielectric spacer layer is removed, thereby exposing a portion of the layer of gate metal between the first and second field-effect transistor structures. A first etch of the layer of gate metal causes removal of the exposed portion of the gate metal layer between the first field-effect transistor structure and the second field-effect transistor structure. A patterned buffer layer is formed over the first region of the monolithic structure. The dielectric spacer layer is removed from the second region of the monolithic structure and the monolithic structure is subjected to a wet second etch, thereby removing the layer of gate metal from the second field-effect transistor structure while the gate metal extending around the first field-effect transistor structure remains intact.

A monolithic structure includes a substrate layer and first and second regions on the substrate layer. The first region includes a first nanosheet transistor structure comprising nanosheet channel regions, a gate metal layer extending around the nanosheet channel regions, and a gate dielectric layer between the nanosheet channel regions and the gate metal layer. The second region includes a second nanosheet transistor structure comprising nanosheet channel regions and a gate dielectric layer adjoining the nanosheet channel regions. A trench between the first nanosheet transistor structure and the second nanosheet transistor structure extends over a boundary between the first region and the second region. The gate metal layer of the first nanosheet transistor structure further includes vertical portions extending orthogonally with respect to the nanosheet channel regions and a horizontal bottom portion. The horizontal bottom portion of the gate metal layer includes a first portion between the substrate layer and a bottom nanosheet channel region and a second portion extending laterally beyond one of the vertical portions of the gate metal layer in the direction of the boundary.

Techniques and structures as disclosed herein can provide substantial beneficial technical effects. By way of example only and without limitation, one or more embodiments may provide one or more of the following advantages:

- Reducing undercut at n/p boundary during gate metal patterning to remove metal from one side and protect another side;
- Reducing n/p boundary impact by addition of a self-aligned spacer and removal of high-k dielectric material in a shared gate region;
- Enabling the use of a very long wet etch, thereby enabling a single process for multiple technology platforms, including high performance (wide sheets/large $W_{eff}$) and general purpose (narrow sheets/narrow $W_{eff}$).

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Replacement metal gate (RMG) patterning is employed to differentiate regions containing n-type transistors from those containing p-type transistors. Gate metal may, for example, be removed from regions that are to contain p-type transistors while the gate metal in the regions containing n-type transistors ideally remains intact. When removing gate metal from selected regions containing nanosheet transistors, aggressive high pH or low pH wet etches containing hydrogen peroxide (for example SC1 and SC2) may be employed to effectively remove metal such as titanium nitride from between closely spaced sheets. Such etches can, however, cause undesirable undercutting of metal in adjoining, protected regions. RMG patterning may further result in edge placement error (EPE), which represents how accurately a "resist" edge is placed with respect to the ideal design.

An exemplary sequence of steps that may be employed for the removal of metal from a region of field-effect transistor structures is shown in FIGS. 1A-1F. The monolithic structure 20 shown in FIG. 1A includes a stack of semiconductor channel layers 21 formed on a substrate 22. The semiconductor layers 21 may be, for example, silicon nanosheets. A gate stack may be formed between the channel layers (silicon nanosheet layers 21) of the structure by removing a dummy gate (not shown) and replacing it with gate materials such as a high-k gate dielectric layer 24 and a gate conductor 26.

The nanosheets can be formed on a semiconductor-on-insulator substrate or on a bulk semiconductor substrate such as a bulk silicon substrate. In one or more exemplary embodiments, the semiconductor nanosheet layers 21 each have a thickness in the range of four to ten nanometers (4-10 nm). The number of semiconductor (channel) layers in the semiconductor layer stack may vary depending on the desired uses and capabilities of the nanosheet transistors to be fabricated. The semiconductor layers 21 are essentially monocrystalline silicon layers and are spaced ten to twenty nanometers (10-20 nm) apart in some embodiments. The width of each semiconductor channel layer 21 is fifty nanometers (50 nm) in some embodiments. The dimensions of the channel layers and the vertical spacing of channel layers should be considered exemplary as opposed to limiting.

Silicon and silicon germanium layers (not shown) can be epitaxially grown in alternating sequence to obtain a vertical stack having the desired number of silicon (channel) layers. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface.

Therefore, an epitaxial semiconductor material has the same crystalline characteristics as the deposition surface on which it is formed.

Source/drain regions (not shown) are epitaxially grown on the exposed edges of the silicon layers 21. Dopants may be incorporated in situ using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). An nFET region(s) includes transistors having n-type source/drain regions while the pFET region(s) includes p-type source/drain regions. Such regions are divided by an n/p boundary as identified in FIG. 1A. Source/drain regions of nanosheet devices are typically grown prior to the RMG process. If vertical transport field-effect transistors (VTFETs) are to be fabricated, source/drain regions are grown prior to RMG in some regions and subsequent to RMG in other regions of a substrate. Techniques as described herein may facilitate the fabrication of various types of FET devices such as VTFETs wherein a wet etch is employed to remove work function metal from one or more regions of a substrate while leaving the work function metal in other region(s) of the substrate essentially intact.

Figure 1A:
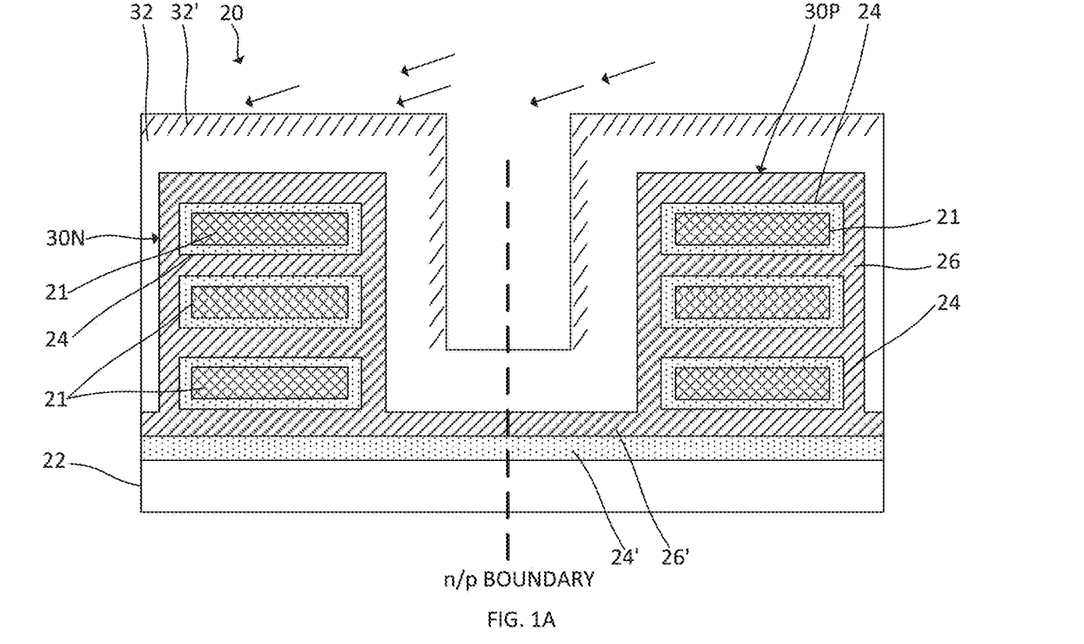
FIG. 1A is a schematic, cross-sectional view showing implantation of a spacer layer to enhance surface hardness during one step of a first sequence of steps for removing metal from an array of nanosheet field-effect transistors.

The silicon germanium layers are selectively removed to obtain a stack of silicon (channel) layers. Hydrogen chloride gas is employed in some embodiments to selectively remove silicon germanium, leaving silicon nanosheets substantially intact. Alternatively, a wet etch process containing ammonia and hydroperoxide can be used to etch SiGe selective to other materials. As shown in FIG. 1A, spaces formed between the silicon (channel) nanosheet layers 21 are filled with gate dielectric and gate metal materials.

Gate stacks are formed in adjoining relation to the nanosheet (channel) layers 21. A gate dielectric layer 24 forms portions of the gate stacks that replace the sacrificial silicon germanium layers. The gate stacks adjoin the silicon nanosheet channel layers 21. Non-limiting examples of suitable materials for the gate dielectric layer 24 include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The high-k material may further include dopants such as, for example, lanthanum and aluminum. The gate dielectric layer 24 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In one exemplary embodiment, a high-k dielectric layer having a thickness of 2.5 nm is employed. In some embodiments, the gate dielectric layer 24 includes multiple layers.

Electrically conductive gate material is deposited in the spaces formerly filled by the silicon germanium layers. The deposited metal gate material forms the metal gate 26 of the nanosheet field-effect transistors. In some embodiments, the electrically conductive gate includes a work function metal (WFM) layer. In some embodiments, the WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process. In one exemplary embodiment, a titanium nitride layer having a thickness of three nanometers (3 nm) is formed on the gate dielectric layer 24. The thickness of the WFM layer may, for example, be in the range of two to ten nanometers (2-10 nm), with thinner layers being used as device scaling decreases.

Each nanosheet FET structure includes transistors 30N, 30P including channel layers 21, associated gate stacks (24, 26), and doped epitaxial source/drain regions (not shown). Some transistor structures 30N are located in an nFET region on one side of the n/p boundary. Other transistor structures 30P are located in a pFET region on the opposite side of the n/p boundary. In an exemplary embodiment, the edges of the channel layers are separated by a distance of about sixty nanometers (60 nm), the gate dielectric layer 24 is a high-k dielectric layer, and the gate metal 26 is titanium nitride. A bottom layer 24' of the high-k gate dielectric material and a bottom layer 26' of gate metal material extend between the nFET and pFET transistor structures and across the n/p boundary. The bottom layer 24' of gate dielectric material is above the substrate 22 and beneath the bottom layer 26' of gate metal material.

As discussed above, gate metal is to be removed from one of the nFET and pFET regions while the gate metal in the other of the regions should remain substantially intact. In one exemplary embodiment, the nFET region is to be protected while metal is removed from the pFET region for subsequent replacement. One exemplary process includes conformally depositing a dielectric spacer layer 32 over the nFET and pFET regions to obtain a structure as schematically illustrated in FIG. 1A.

Figure 1B:
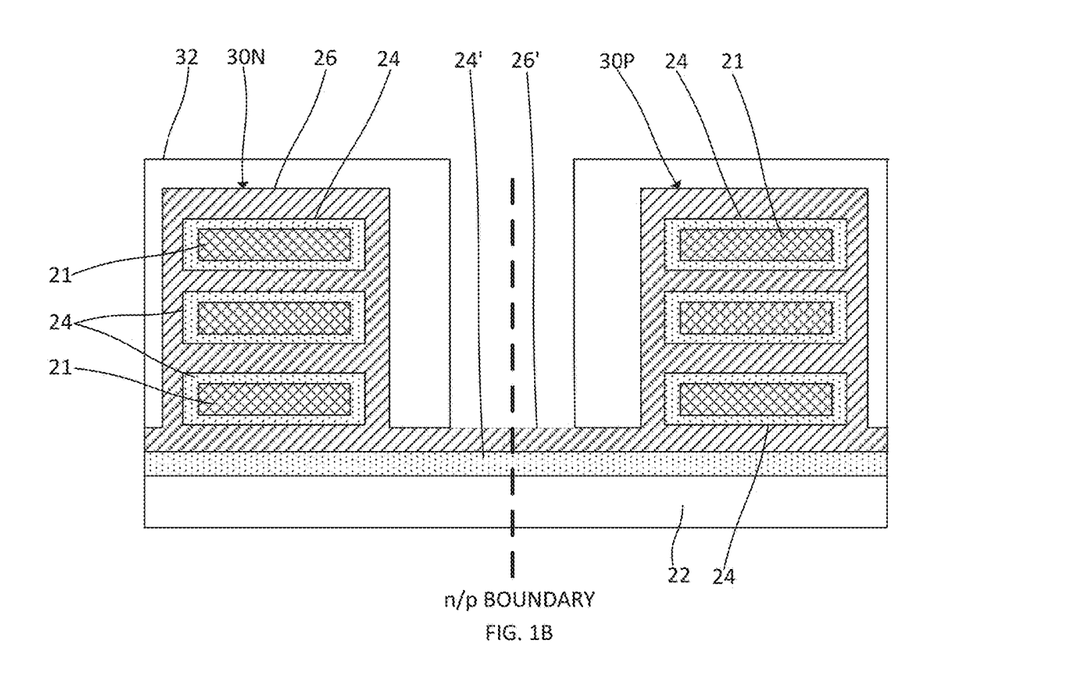
FIG. 1B is a schematic, cross-sectional view thereof following partial removal of the spacer layer.

Referring again to FIG. 1A, the spacer layer 32 is subjected to a top surface treatment such as implantation that hardens the top surface thereof and improves etch selectivity. Ion implantation may be performed using, for example, carbon or oxygen ions to increase near-surface hardness which corresponds in depth to the ion penetration depth profile. In embodiments that employ a $SiO_x$ spacer layer, carbon implantation can be employed to enhance surface hardness, thereby forming a protective layer. $O_x$ implantation improves the hardness of a SiN spacer layer. The horizontal portion of the spacer layer 32 between the nFET and pFET transistors 30N, 30P remains essentially untreated due to the angle of ion implantation employed. The resulting structure is then subjected to spacer RIE (reactive ion etch) to remove the horizontal portion of the spacer layer 32 between nFET and pFET transistors. As shown in FIG. 1B, the top surface of the metal layer 26' is exposed in the n/p boundary area following partial removal of the spacer layer 32. The transistor structures in both the nFET and pFET regions remain protected by spacer material.

Figure 1C:
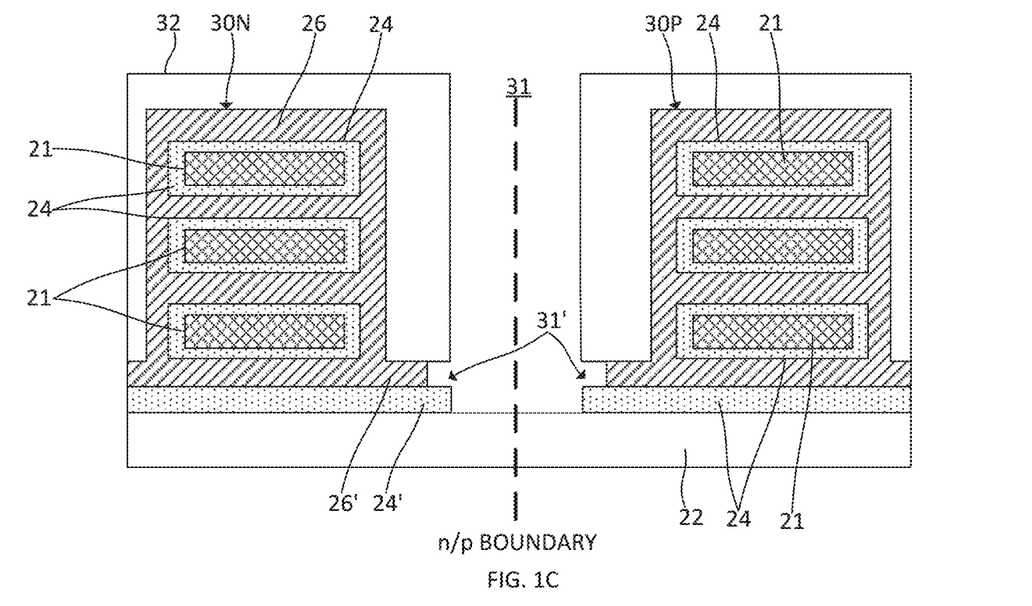
FIG. 1C is a schematic, cross-sectional view thereof following removal of portions of a metal layer and a dielectric layer.

Referring to FIG. 1C, portions of the metal layer 26' and the dielectric layer 24' between the nFET and pFET structures 30N, 30P are partially removed to form electrically isolated gate regions from the shared gate region shown in FIG. 1C. The metal layer 26' over the n/p boundary may be removed using, for example, a timed SC1 etch. Some undercutting of the metal beneath the spacer layer 32 is expected, forming indents/cavities 31' extending from the trench 31 between the nFET and pFET structures. Such undercutting stops well before metal is removed directly beneath the channel layers 21 of the nFET and pFET structures 30N, 30P, leaving portions of the metal layer 26' extending laterally from the gate metal layer 26 surrounding the channel layers. Removal of dielectric material from the layer 24' is optional; a thin layer of dielectric material may be removed using the same etch employed to remove portions of the metal layer 26'. Portions of the dielectric layer 24' remain beneath the remaining portions of the metal layer 26'. It will be appreciated that other etch processes may alternatively be employed to remove the portions of the metal and dielectric layers that extend over the n/p boundary.

Figure 1D:
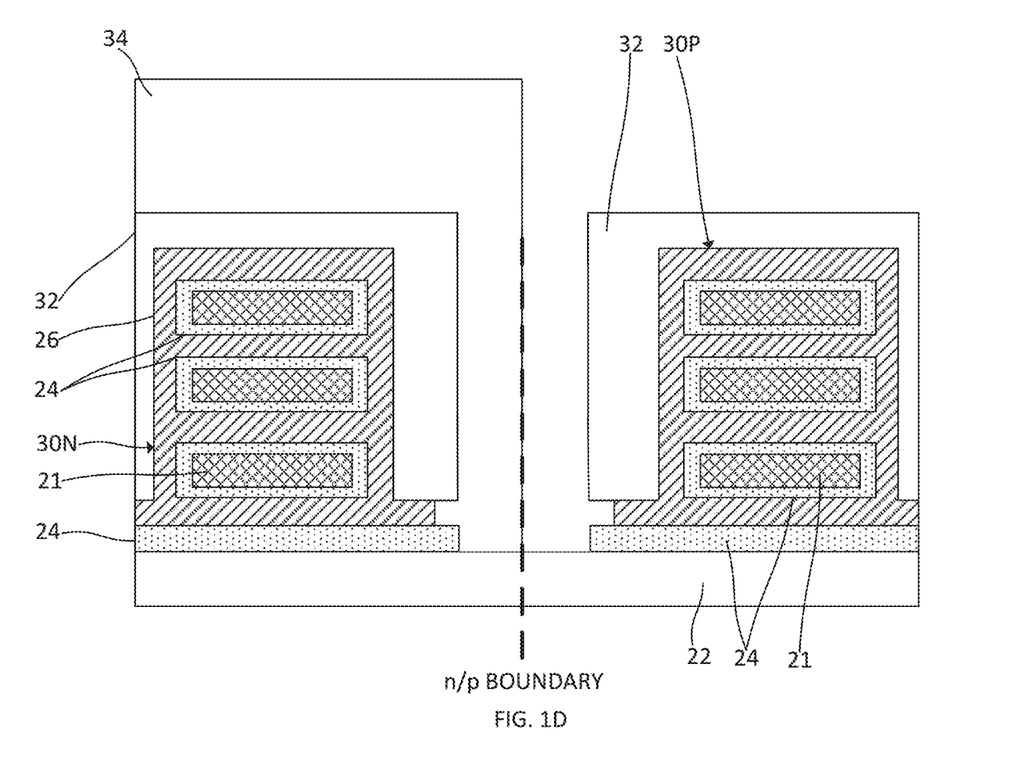
FIG. 1D is a schematic, cross-sectional view thereof following deposition of an organic planarization layer (OPL) and patterning thereof.

An organic planarization layer (OPL) 34 is deposited on the resulting structure and patterned. Depending on the technique employed for patterning, the layer 34 may further include a hard mask on the OPL, such as a low-temperature oxide (LTO) or a silicon-containing anti-reflective coating (SiARC). As shown in FIG. 1D, the nFET structure 30N and spacer layer 32 in the nFET region are protected by the patterned OPL while the pFET structure and spacer in the pFET region are exposed.

Figure 1E:
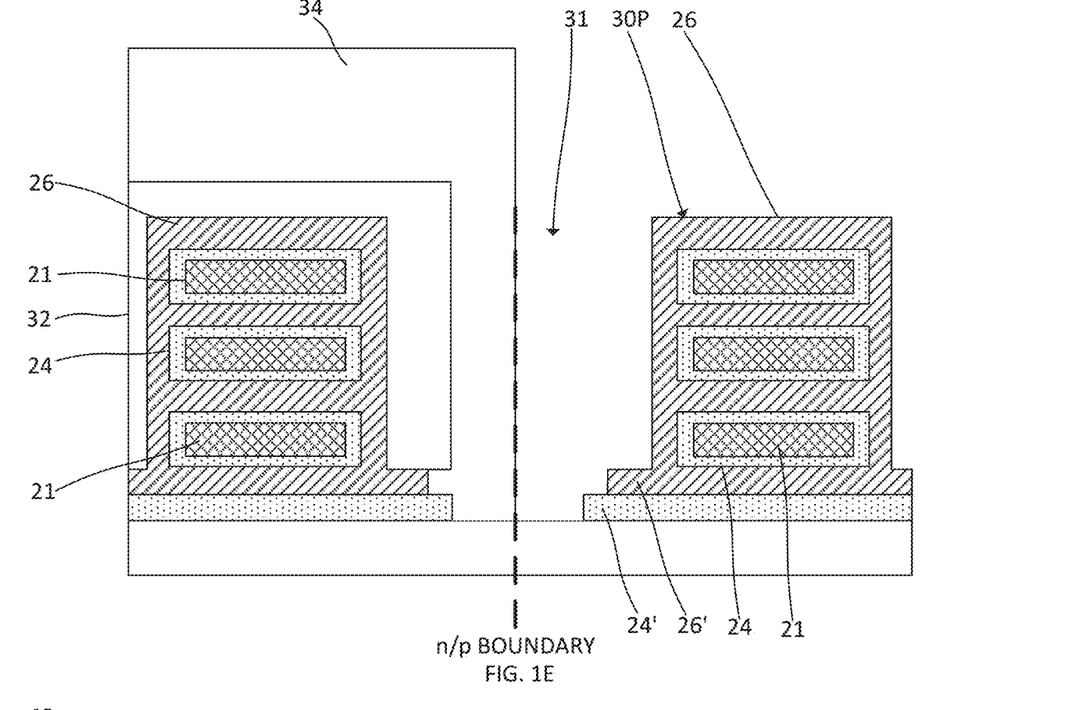
FIG. 1E is a schematic, cross-sectional view thereof following removal of the spacer layer from one region of the array.

The spacer layer 32 is removed from the pFET region. The pFET structure 30P is exposed following spacer layer removal as schematically illustrated in FIG. 1E. Buffered hydrofluoric acid is among the materials that can be used to etch silicon dioxide in embodiments where a silicon dioxide spacer layer is employed. A silicon nitride spacer layer can be etched selectively using, for example, hot phosphoric acid.

Figure 1F:
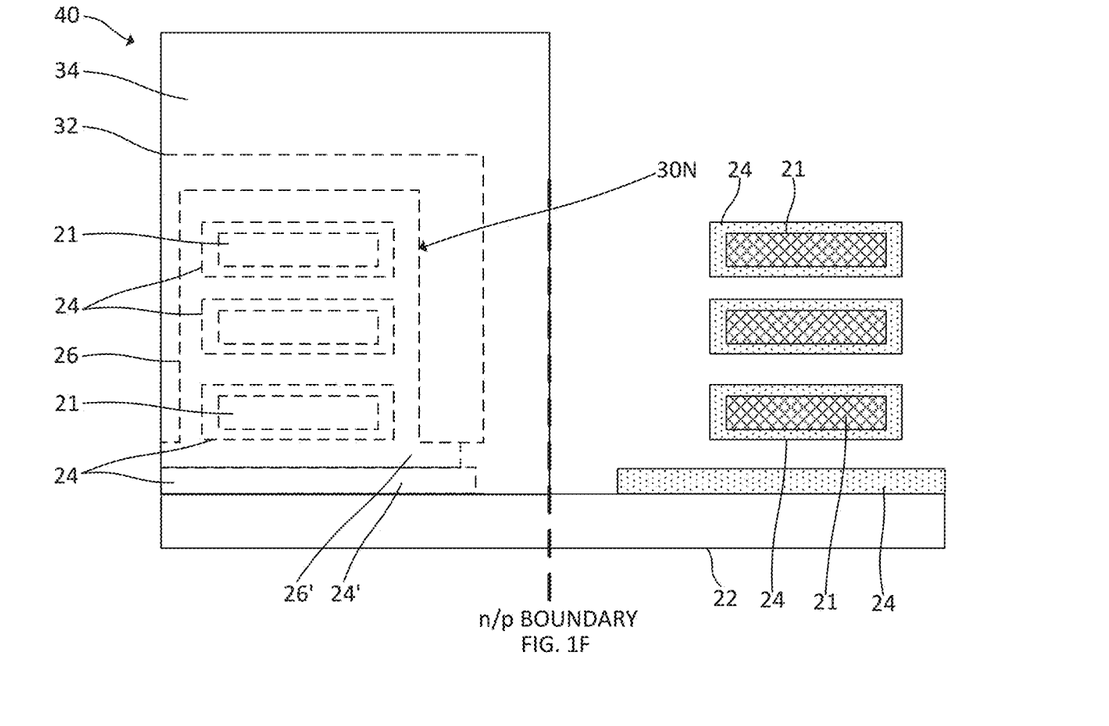
FIG. 1F is a schematic, cross-sectional view thereof following removal of gate metal from the one region of the array.

Gate metal is removed from the pFET region while the protected nFET region remains intact. An SC1 etch, an SC2 etch or other suitable etch processes can be employed to remove gate metal such as titanium nitride. The mask layer 34, which covers the nFET region and extends down to the top surface of the substrate 22, protects the nFET structures and the laterally extending portion of the bottom gate metal layer 26'. Further undercutting of gate metal from the nFET region is effectively prevented, leaving the inner edge of the metal layer 26' intact and at a fixed position. The duration of the etch, which is sufficient to allow removal of all gate metal from the pFET region, does not affect the gate metal in the nFET region. FIG. 1F schematically illustrates the resulting monolithic structure 40.

The exemplary monolithic structure 40 shown in FIG. 1F includes a substrate layer 22. A first region (an nFET region) on the substrate layer includes a first nanosheet transistor structure 30N comprising nanosheet channel regions 21, a gate metal layer 26 extending around the nanosheet channel regions 21, and a gate dielectric layer 24 between the nanosheet channel regions and the gate metal layer 26. The second region (a pFET region) on the substrate layer includes a second nanosheet transistor structure 30P includes nanosheet channel regions 21 and a gate dielectric layer 24 adjoining the nanosheet channel regions. The second nanosheet transistor structure 30P does not include gate metal at this stage of the process. A trench 31 between the nanosheet transistor structures extends over the n/p boundary between the first region and the second region. The gate metal layer of one nanosheet transistor structure (or all nanosheet transistor structures that may be in the nFET region) includes vertical portions extending orthogonally with respect to the nanosheet channel regions 21 and a horizontal bottom portion 26'. The horizontal bottom portion 26' of the gate metal layer includes a first portion between the substrate layer 22 and a bottom nanosheet channel region 21. As undercutting of gate metal is limited during the first etch thereof (FIG. 1C) and prevented during the second etch, a second portion of the horizontal bottom portion 26' of the gate metal extends laterally beyond the vertical portion of the gate metal layer 26 in the direction of the n/p boundary. A first segment of the bottom layer 24' of gate dielectric material on the substrate layer 22 extends laterally beyond the first nanosheet transistor structure 30N in the direction of the n/p boundary and terminates within the nFET region on a first side of the n/p boundary. The fabrication process, which limits undercutting of metal near the n/p boundary, allows the inner edge of the horizontal bottom layer 26' of the gate metal to be formed in a consistently accurate lateral position with respect to the substrate layer. A second segment of the layer of gate dielectric material 24' is beneath the nanosheet transistor structure(s) in the adjoining region. The second layer of gate dielectric material extends laterally beyond the second nanosheet transistor structure 30P in the direction of the n/p boundary and terminates within the pFET region on the pFET side of the n/p boundary. The absence of high-k dielectric material and metal over the n/p boundary helps reduce n/p boundary impact (i.e., reduce the local layout effect).

The monolithic structure 40 further includes a dielectric spacer layer 32 over the nanosheet transistor structure 30N in the nFET region. The dielectric spacer layer 32 includes a bottom surface adjoining the portion of the bottom gate metal layer 26' that extends laterally beyond the nanosheet transistor structure 30N. Due to the limited undercutting of gate metal beneath the spacer layer 32 in the first etch process described above, the spacer layer 32 extends laterally further than the end of the layer 26' of gate metal, thereby forming the laterally extending cavities 31'. The organic planarization layer 34 encases the nanosheet transistor structure 30N and the spacer layer 32 thereon.

Following removal of the originally deposited pFET gate metal 26, new gate metal deemed appropriate for the pFET transistors is deposited in the pFET region. The nFET region remains protected during pFET gate metal replacement. Further processing, such as interlevel dielectric (ILD) deposition and contact formation may subsequently be performed after completion of the transistors in the pFET region.

Figure 2A:
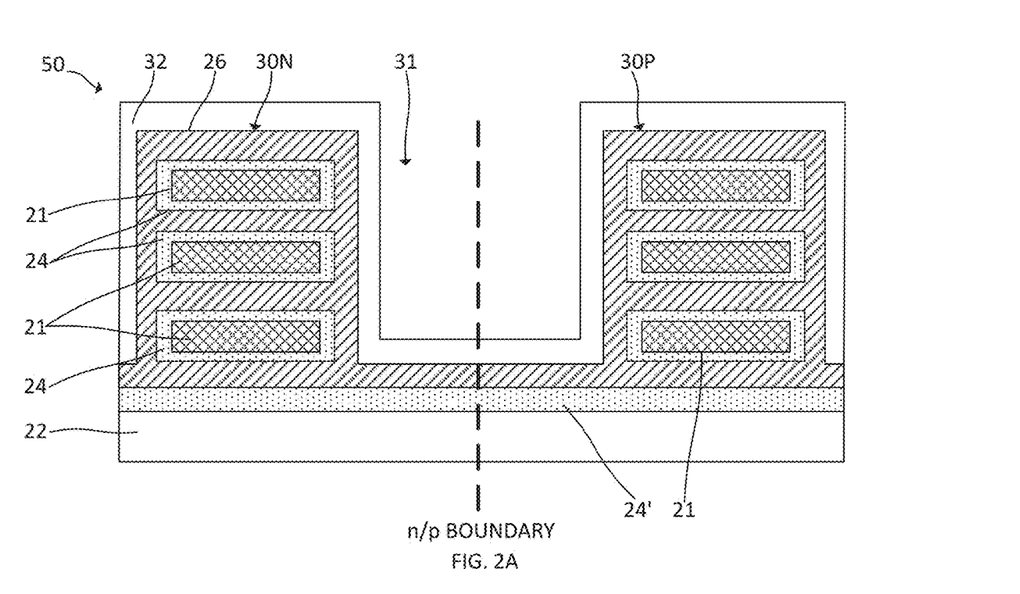
FIG. 2A is a schematic, cross-sectional view showing deposition of a conformal, dielectric spacer layer over an array of nanosheet field-effect transistors during one of a series of sequential steps in an alternative process of removing metal from an array of nanosheet field-effect transistors.

FIGS. 2A-2F schematically illustrate an alternative sequence of steps for removing gate metal from one region of a substrate while avoiding unwanted undercut etching of the gate metal within an adjoining region. The same reference numerals used with respect to FIGS. 1A-1G are employed to designate similar elements. Referring to FIG. 2A, an exemplary structure 50 includes an n/p boundary that divides an nFET region from a pFET region. The nFET region comprises transistor structures 30N that are later employed as nFET transistors in, for example, a logic circuit. The pFET region includes transistor structures 30P that are later configured as pFET transistors. A trench 31 is present between nFET and pFET transistor structures. A dielectric spacer layer 32 is conformally deposited on the nFET and pFET regions to obtain the exemplary structure 50.

Figure 2B:
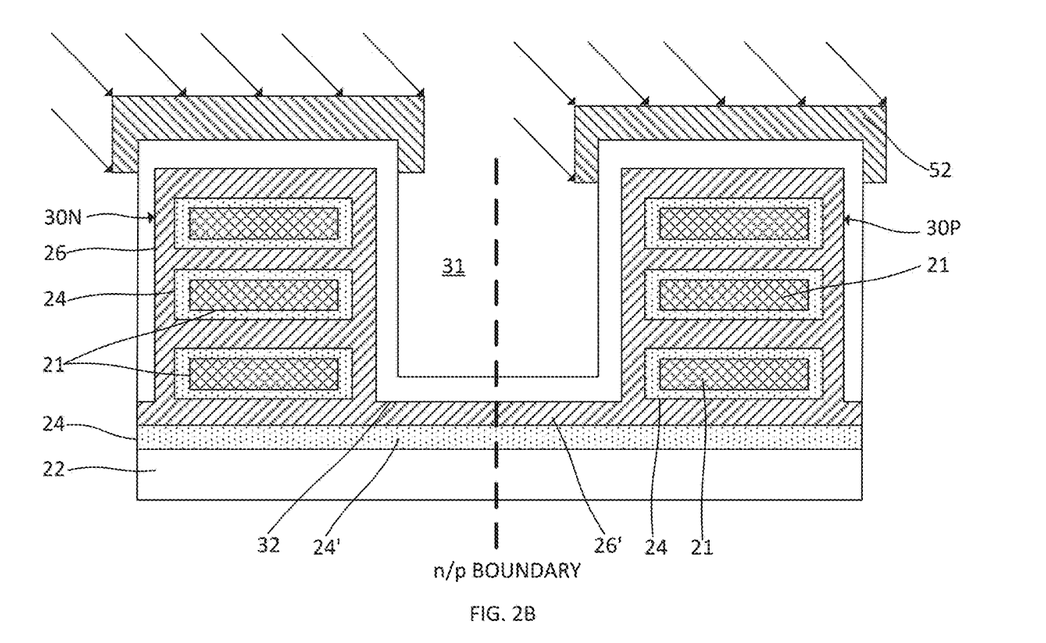
FIG. 2B is a schematic, cross-sectional view thereof following deposition of a protective hard mask over the dielectric spacer layer.

A protective hard mask 52 is non-conformally deposited on the structure 50. An angled directional deposition process may be employed in depositing the hard mask. As schematically illustrated in FIG. 2B, the hard mask 52 covers the top surfaces of the transistor structures 30N, 30P, but does not extend fully into the trench 31 between the transistor structures. The vertical sidewalls of the spacer layer 32 adjoining most of the trench 31 remain essentially uncovered by hard mask material, though the portions of the spacer layer sidewalls near the top of the trench are expected to be coated as illustrated. The horizontal portion of the hard mask at the bottom of the trench 31 also remains essentially uncoated. An angled physical vapor deposition (PVD) process (represented by arrows in FIG. 2B) may be employed for the non-conformal deposition of hard mask material. The aspect ratio of the trench 31 and the angle of hard mask deposition are factors in determining the extent of hard mask coverage of the structure 50. The hard mask 52 may be comprised of any suitable material that facilitates subsequent selective etching of the spacer layer 32, the bottom gate metal layer 26' and the bottom dielectric layer 24'. Exemplary hard mask materials include PVD-deposited silicon and silicon germanium. Carbon may alternatively be deposited to form the hard mask.

Figure 2C:
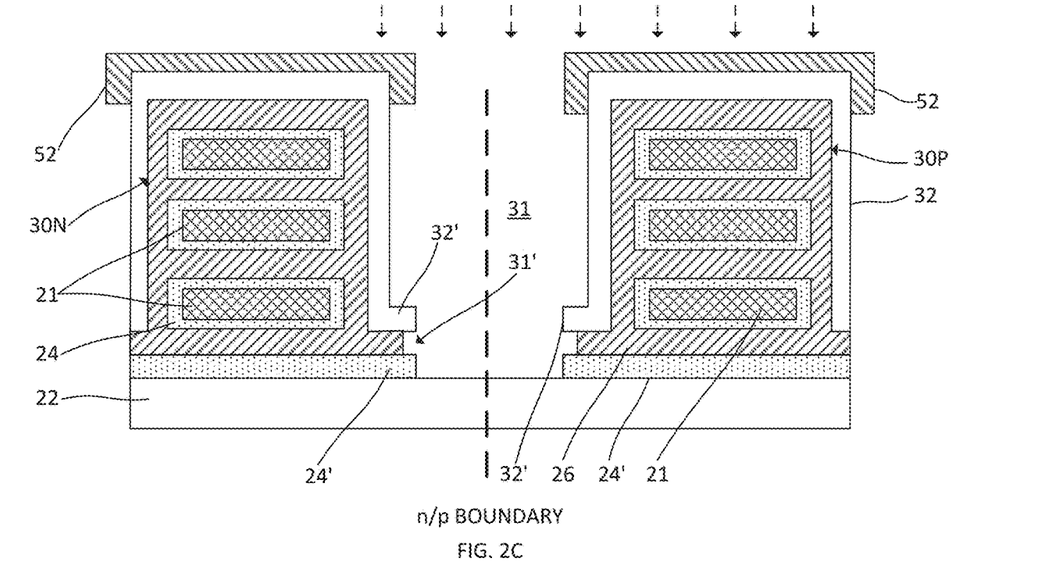
FIG. 2C is a schematic, cross-sectional view thereof following sequential etching of the dielectric spacer layer, a metal layer, and a bottom dielectric layer over an n/p boundary.

Spacer RIE causes the removal of the horizontal portion of the spacer layer 32 beneath the opening defined by the portions of the hard mask 52 on the transistor structures 30N, 30P. Because the hard mask 52 extends partially within the trench 31, lateral extensions 32' of the spacer 32 remain following RIE and extend beyond the vertical sidewalls of the spacer layer 32. Portions of the metal layer 26' and the dielectric layer 24' between the nFET and transistors 30N, 30P are then removed. The portions of the metal layer 26' may be removed using, for example, a timed SC1 etch. Some undercutting of the metal between the spacer layer 32 and the dielectric layer 24 is expected in both the nFET and pFET regions, but will be limited as metal removal from the bottom trench 31 is significantly less difficult than its removal from between channel layers. Such undercutting stops well before metal is removed directly beneath the channel layers 21 of the nFET and pFET transistors 30N, 30P. The dielectric material over the n/p boundary may be removed using a wet etch containing hydrofluoric acid. It will be appreciated that other etch processes may alternatively be employed to remove the portions of the metal and dielectric layers that extend over the n/p boundary. FIG. 2C provides a cross-sectional view of an exemplary structure following sequential etching of the spacer 32, the metal layer 26', and the bottom dielectric layer 24'.

Figure 2D:
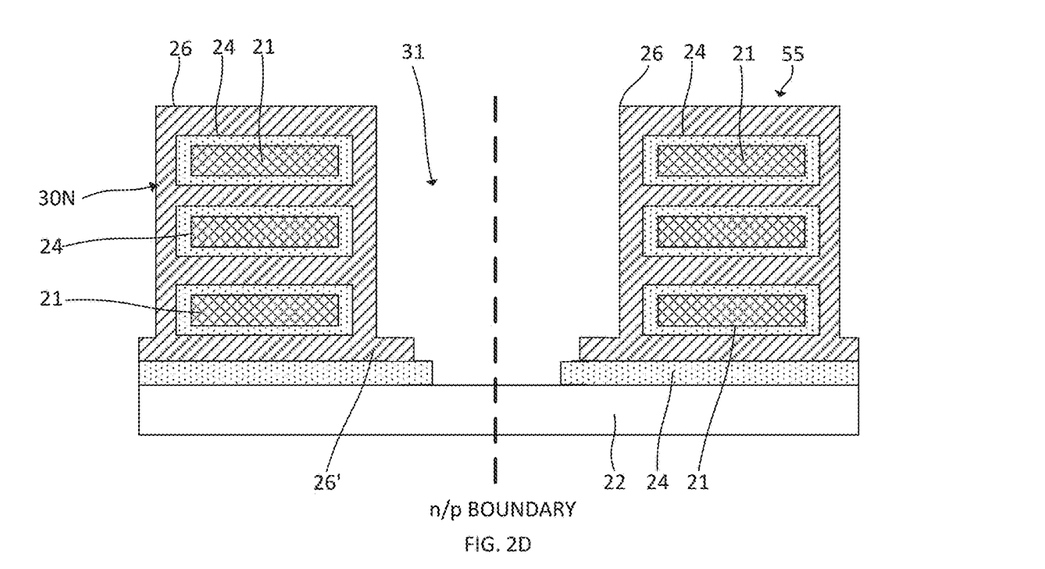
FIG. 2D is a schematic, cross-sectional view thereof following removal of the hard mask and the dielectric spacer layer.

The hard mask 52 and the spacer layer 32 are removed to obtain a structure 55 as schematically illustrated in FIG. 2D. A wet etch in TMAH (tetramethylammonium hydroxide) can be employed to remove silicon or silicon germanium selectively with respect to titanium nitride in embodiments wherein a silicon or silicon germanium hard mask is employed. A carbon hard mask can be removed using $N_2/O_2$ chemistries. As discussed above, buffered hydrofluoric acid or hot phosphoric acid to remove the spacer layer depending on the composition of the spacer layer. The gate metal 26, 26' in both the nFET and pFET regions is exposed following spacer layer removal.

Figure 2E:
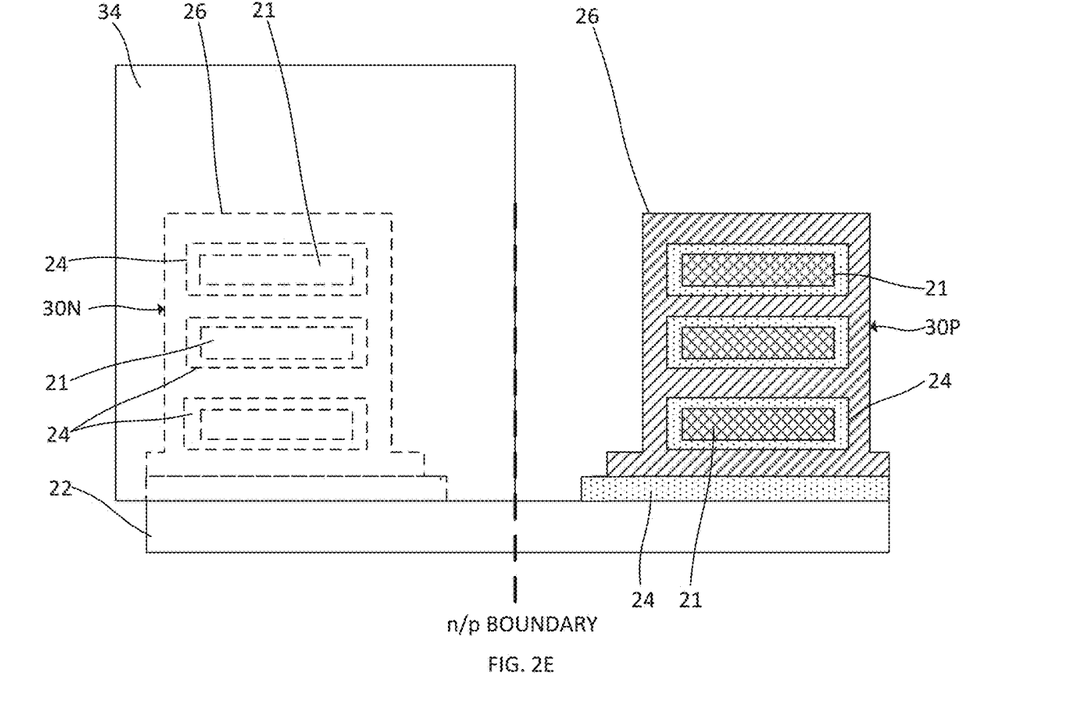
FIG. 2E is a schematic, cross-sectional view thereof following deposition and patterning of an organic planarization layer.

An organic planarization layer (OPL) 34 is deposited on the resulting structure and patterned. Depending on the technique employed for patterning, the layer 34 may further include a hard mask on the OPL, such as a low-temperature oxide (LTO) or a silicon-containing anti-reflective coating (SiARC). As shown in FIG. 2E, the nFET structure 30N in the nFET region is protected by the patterned OPL while the pFET structure 30P in the pFET region is exposed. The organic planarization layer extends down to the top surface of the substrate 22 and has a sidewall coplanar with the n/p boundary in the exemplary embodiment.

Figure 2F:
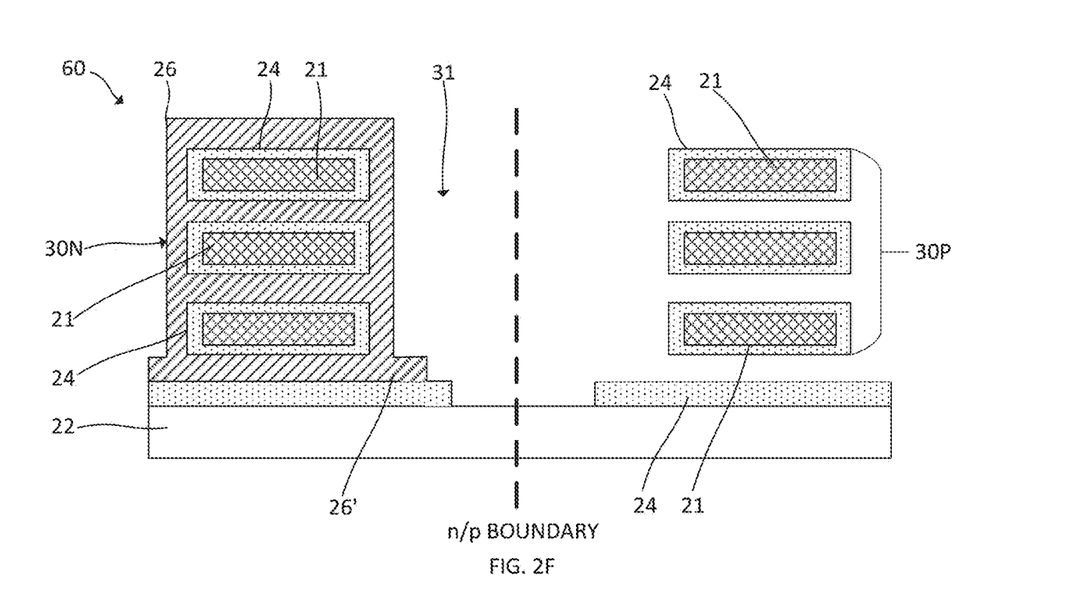
FIG. 2F is a schematic, cross-sectional view thereof following removal of gate metal from one region of the array and removal of the organic planarization layer.

The gate metal 26, 26' is removed from the pFET region using a suitable wet chemical etch. The gate metal in the nFET region, which is protected by the OPL 34, remains intact even if a relatively long etch duration is required. A monolithic structure 60 as illustrated in FIG. 2F is obtained following removal of the OPL 34 after the wet etch is completed. The monolithic structure is similar to the structure 40 described above with respect to FIG. 1G, but includes neither a spacer layer nor an organic planarization layer. The structure includes nFET and pFET regions separated by an n/p boundary. A first region (the nFET region in the exemplary embodiment) includes a nanosheet transistor structure comprising stack of nanosheet channel layers 21, a gate dielectric layer 24 adjoining the channel layers, and the originally deposited gate metal 26, 26' surrounding the channel layers and gate dielectric layer. The second region includes a nanosheet transistor structure including a stack of nanosheet channel layers 21 and a gate dielectric layer 24 adjoining the channel layers. The areas between channel layers are devoid of gate metal. A horizontal layer 24' of gate dielectric material remains between each nanosheet transistor structure and a substrate 22. The dielectric layer 24' includes first and second segments that are separated by a gap between the nanosheet transistor structures and over the n/p boundary. The gate metal includes a bottom, horizontal layer 26' that adjoins the bottom layer 24' of gate dielectric material and extends laterally beyond the nanosheet transistor structure in the nFET region. The bottom layer 24' of gate metal terminates within the nFET region on one side of the n/p boundary.

Figure 3A:
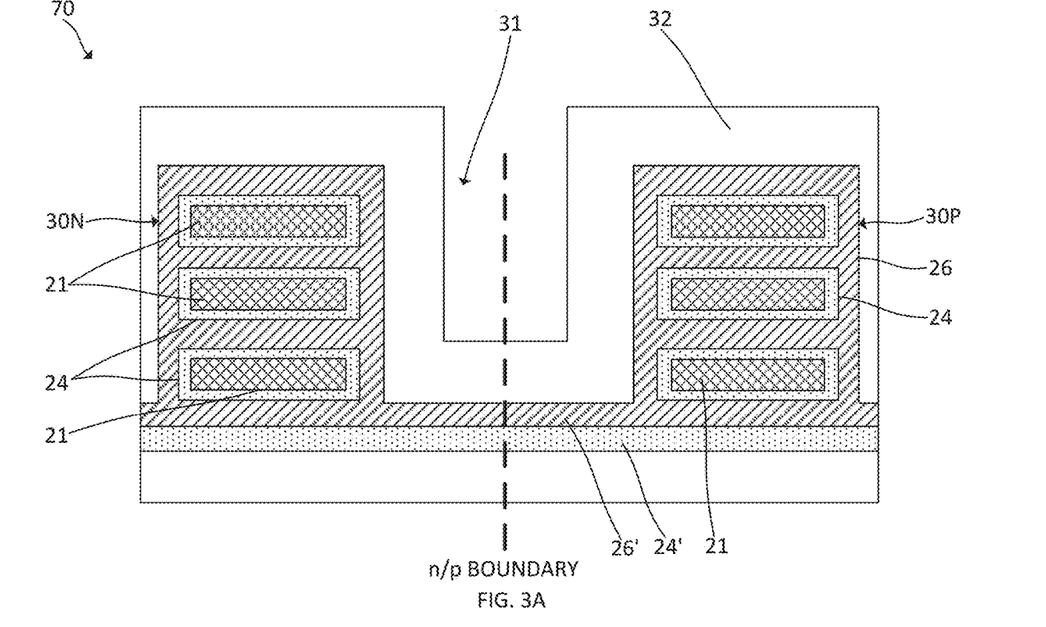
FIG. 3A is a schematic, cross-sectional view showing an intermediate structure obtained during a series of sequential steps of a further alternative process of removing metal from an array of nanosheet field-effect transistors.

FIGS. 3A-3H are schematic, cross-sectional views showing sequential steps of a further alternative process of removing metal from an array of nanosheet field-effect transistor structures. The same reference numerals are employed in these figures as used above to designate similar elements. As shown in FIG. 3A, an exemplary structure 70 includes an n/p boundary that divides an nFET region from a pFET region. The nFET region comprises transistor structures 30N that are later employed as nFETs in, for example, a logic circuit. The pFET region includes transistor structures 30P that are later configured as pFETs. A trench 31 is present between nFET and pFET transistor structures. A dielectric spacer layer 32 is conformally deposited on the nFET and pFET regions to obtain the exemplary structure 70.

Figure 3B:
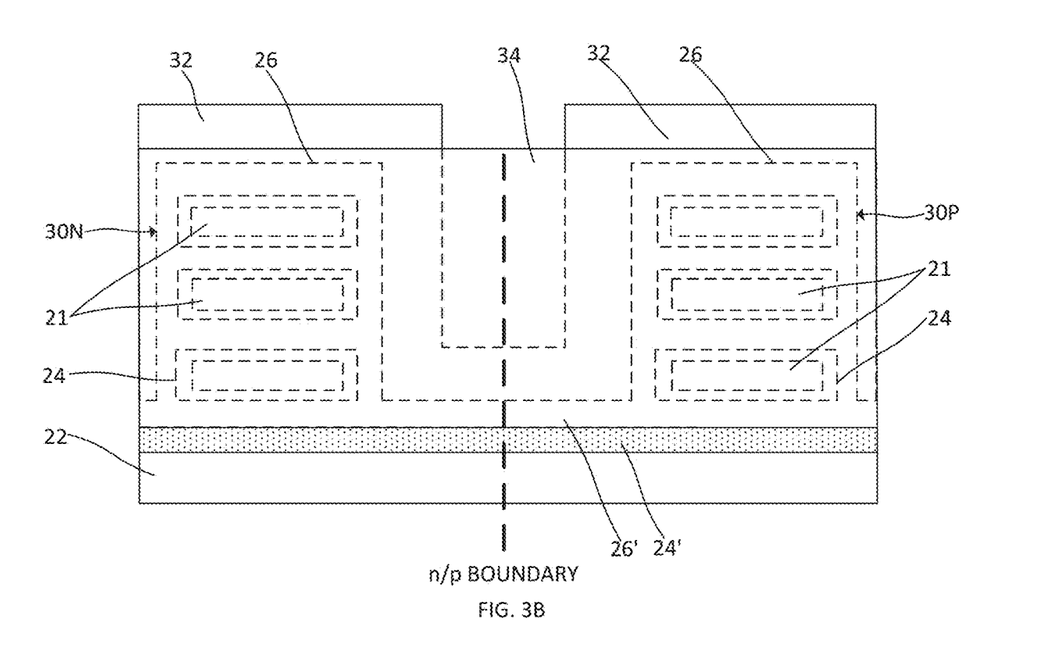
FIG. 3B is a schematic, cross-sectional view thereof following deposition of an organic planarization layer on the structure shown in FIG. 3A.
Figure 3C:
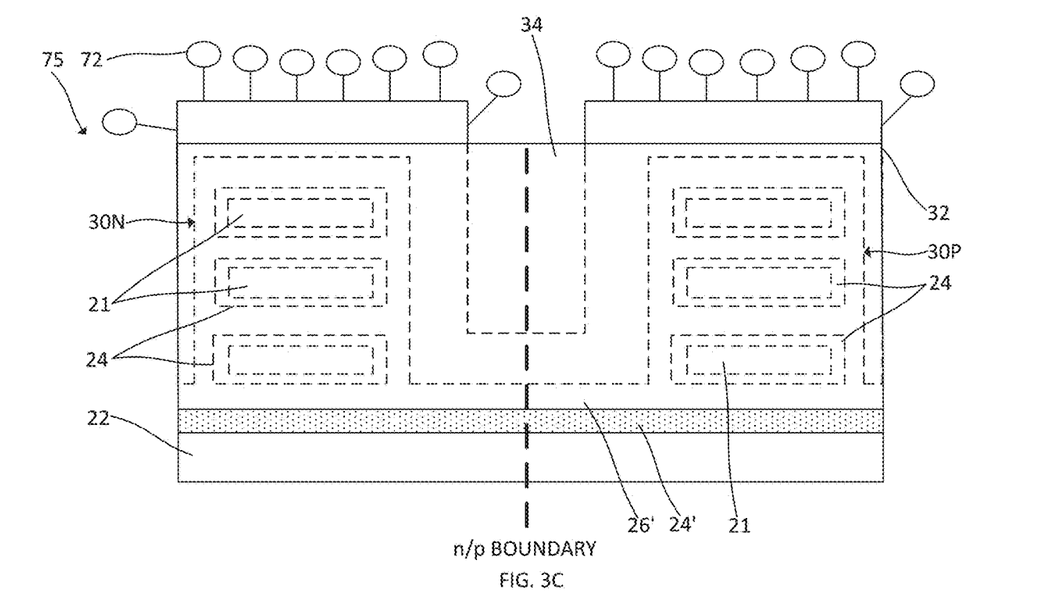
FIG. 3C is a schematic, cross-sectional view thereof following deposition of a protective layer on a conformal, dielectric spacer layer.

An organic planarization layer 34 is deposited on the structure and etched back to expose only the top surfaces of the spacer layer 32 in the nFET and the pFET regions. The OPL 34 covers the nFET and pFET transistor structures and fills the trench between the structures. FIG. 3B schematically illustrates an exemplary nanosheet transistor array following OPL deposition and etch-back. A protective layer 72 is formed on the exposed surfaces of the spacer layer 32 as a spin-on coat with protective polymer brush/self-assembled monolayer (SAM). The polymer brush derives from a polymer structure could, for example, be polystyrene/poly-hydroxystyrene derived with a typical formula of HO—$(CH_2CH_2PhOH)_m$—$(CH_2CH_2Ph)_n$—H having a molecular weight distribution of 5,000 Daltons (D) to 15,000 D. In an exemplary embodiment, a casting solvent (e.g., propylene glycol methyl ether acetate; ethyl lactate; n-butyl acetate; and gamma butyric lactone) is used to dissolve a polymer brush/SAM. A thin, uniform coating of the polymer brush at a specific, well controlled thickness may be obtained by spin coating. More specifically, a centrifugal force is applied by a machine, referred to as a spin coater, or spinner. Higher angular speeds lead to thinner coatings. The polymer used to derive the polymer brush is rendered into a liquid form by dissolving the solid components in the casting solvent. For example, the polymer solution is 2-10 percent solution by weight in the casting solvent. The polymer solution is poured onto the substrate, which is then spun on a turntable at a high speed producing the desired film. Thickness control and uniformity and low defect density may require particular attention to be paid to this process, where a large number of parameters can have significant impact on polymer brush thickness uniformity and control. The speed in which the polymer solution is spun on the turn table influences the thickness of the resulting film. Depending on the semiconductor manufacturer or the other components within a desired product, a film of a certain thickness may be preferred or required. For example, if the film is too thick, the polymer brush may leach into the surface. The next step is to bake the polymer brush. Baking the polymer brush is also referred to as a post-apply bake process, and is also called a "softbake" or a "prebake". In some embodiments, baking is accomplished by utilizing a convection oven or hotplate oven. Baking involves: (i) drying the dissolved polymer after spin coat by removing this excess solvent; and (ii) grafting the oxygen (O) of the polymer brush onto the silicon nitride surface. For polyhydroxy styrene, the baking temperatures can range from 200-250° C. in order to graft the oxygen atom onto the spacer surface. Grafting removes the hydroxyl group functionality by creating silicon-oxygen (Si—O) bonds. The oxygen (O) derives from the hydroxyl group of the brush while the silicon (Si) derives from the spacer surface. The brush chemistry employed causes bonding of the protective layer only to the exposed spacer material. The exposed portions of the spacer layer over both the nFET and the pFET structures are protected by the protective layer 72. FIG. 3C schematically illustrates an exemplary nanosheet structure 75 following deposition of the protective layer 72.

Figure 3D:
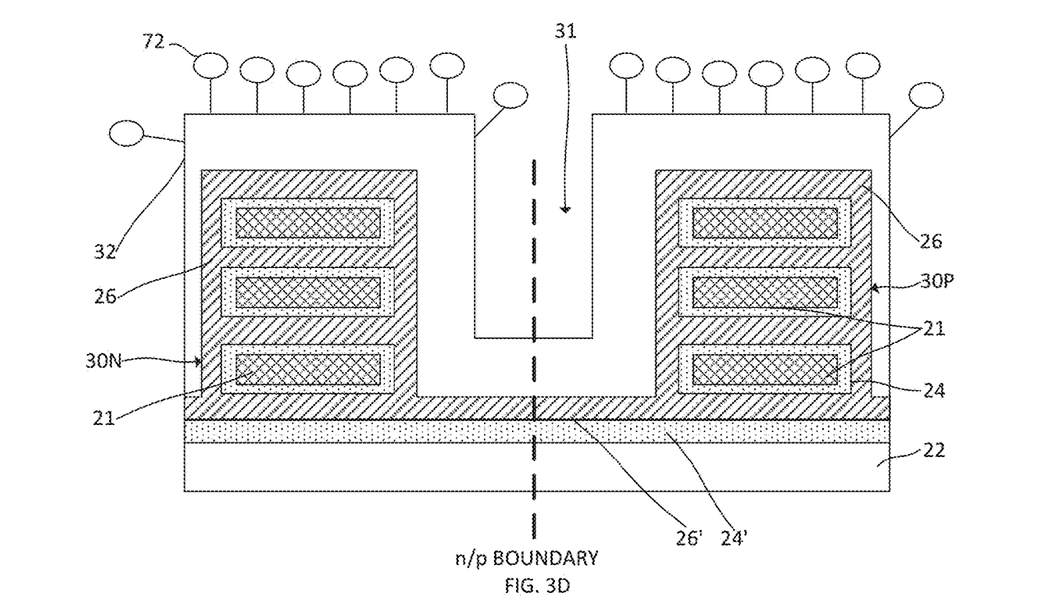
FIG. 3D is a schematic, cross-sectional view thereof following removal of the organic planarization layer.
Figure 3E:
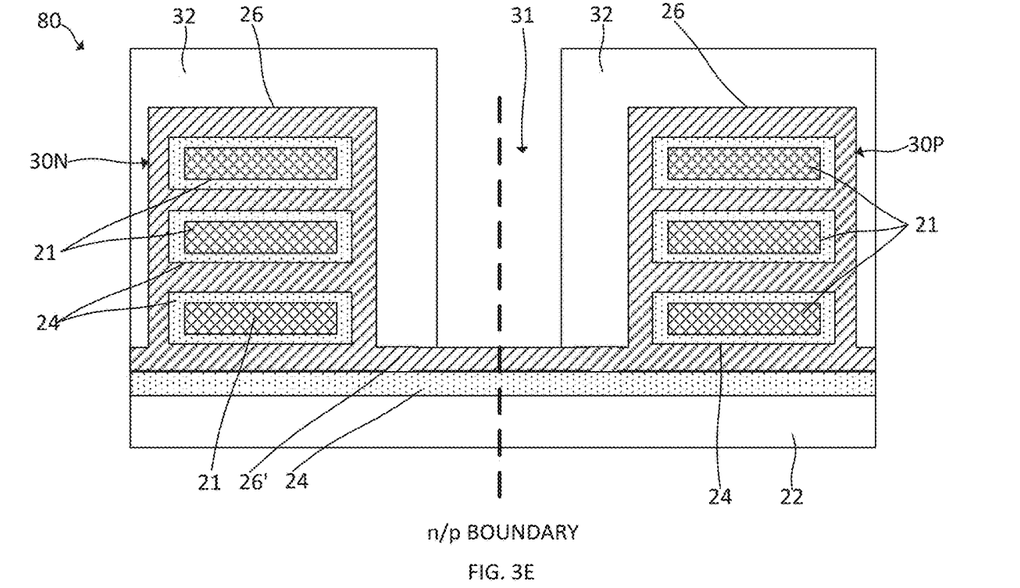
FIG. 3E is a schematic, cross-sectional view thereof following a directional etch of the dielectric spacer layer and removal of the protective layer.

Referring to FIG. 3D, the organic planarization layer is removed. Such removal exposes the unprotected sidewalls and bottom surface of the spacer layer 32 that bound the trench 31. Spacer RIE causes removal of spacer material at the bottom of the trench 31. The protected top surfaces of the spacer layer 32 and the spacer sidewalls directly beneath the protective layer 72 remain essentially intact. A surface of the gate metal layer 26' is exposed. The nanosheet transistor structures 30N, 30P are embedded within the remaining portions of the spacer layer 32. Upon removal of the protective layer 72 following spacer RIE, a structure 80 as schematically illustrated in FIG. 3E may be obtained. The brush protective layer is then removed by a short room temperature oxygen plasma exposure (<1 minute) such as that which is typically used to clean semiconductor surfaces of organics.

Figure 3F:
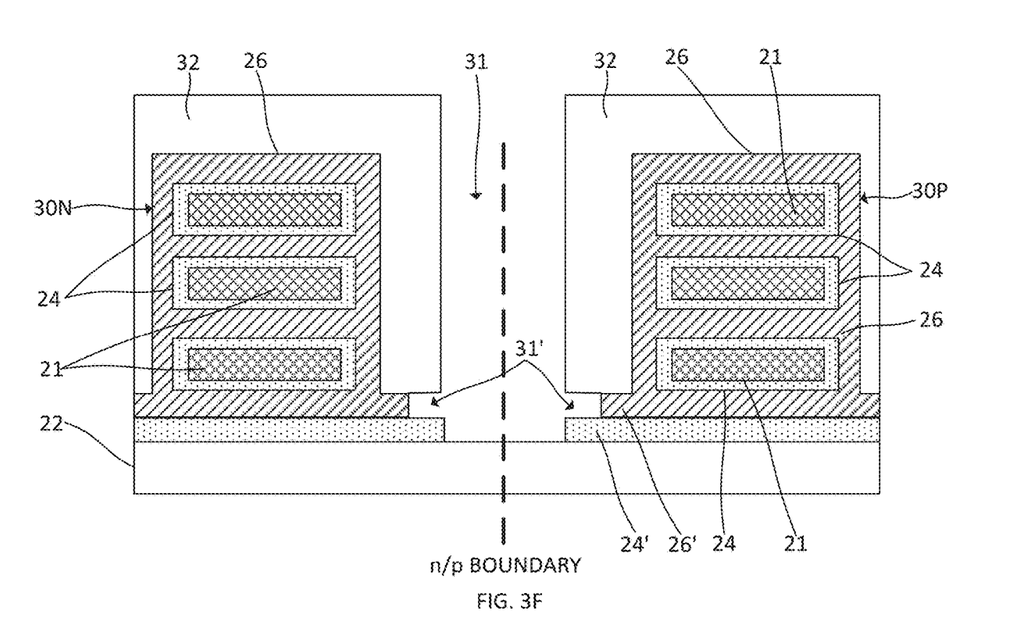
FIG. 3F is a schematic, cross-sectional view thereof following an initial etch of a metal layer and partial removal of a dielectric layer over an n/p boundary.

Portions of the metal layer 26' and dielectric layer 24' are simultaneously or sequentially etched down to the top surface of the substrate 22. The nanosheet transistor structures 30N, 30P are protected by the spacer layer 32 and remain essentially intact. The metal layer 26' beneath the spacer layer 32 is undercut beneath the spacer layer 32, but the etch is timed such that undercutting is discontinued prior to extending beneath the transistors. Portions of the metal layer 26' accordingly extend laterally beyond the transistor structures in the direction of the trench 31, but terminate before the n/p boundary. The segments of the dielectric layer 24' on the substrate that remain following etching will also extend laterally beyond the inner surfaces of the transistor structures 30N, 30P following partial removal thereof. The inner ends of the segments terminate short of the n/p boundary. There is accordingly no gate metal or gate dielectric material directly over the n/p boundary. An exemplary structure following initial etching of the metal and partial removal of the dielectric layer 24' is shown in FIG. 3F.

Figure 3G:
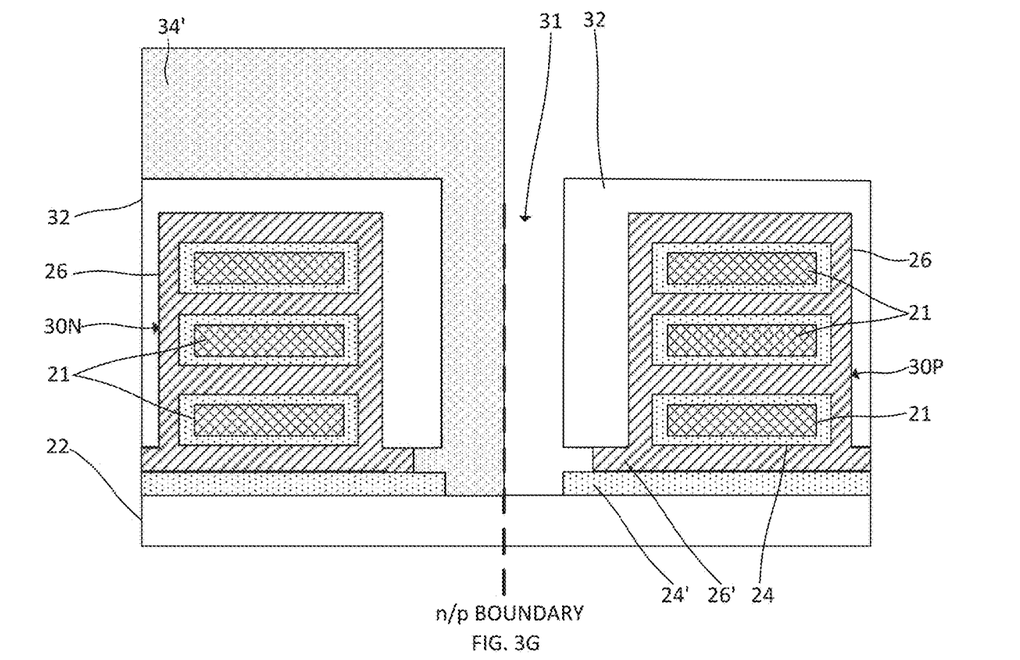
FIG. 3G is a schematic, cross-sectional view thereof following formation of a second organic planarization layer over a first region of the array.

Referring to FIG. 3G, a further organic planarization layer 34' is deposited over the structure and subjected to patterning. The patterned OPL 34' covers the nFET region in an exemplary embodiment while the pFET region is unprotected. The spacer layer 32 is then removed from the pFET region. The gate metal 32 of the resulting structure in the pFET region is exposed while the transistor structure(s) 30N and spacer layer 32 in the nFET region remain essentially intact. The etch process chosen to remove the spacer layer is dependent on the dielectric material used to form the spacer layer.

Figure 3H:
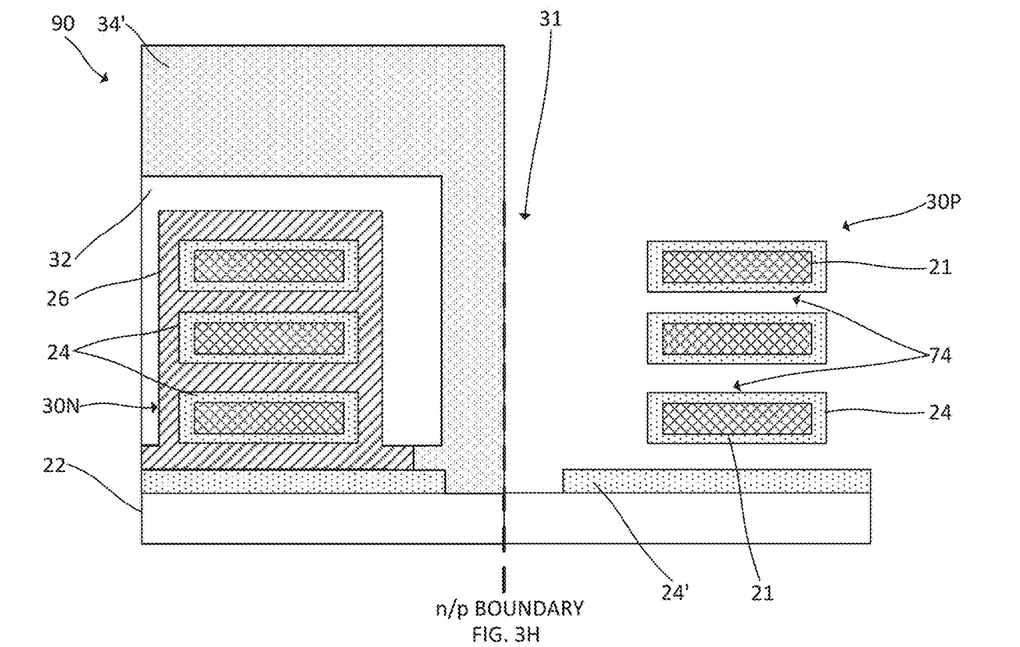
FIG. 3H is a schematic, cross-sectional view thereof following removal of gate metal from a second region of the array.

Gate metal is removed from the pFET region to obtain a monolithic structure 90 as schematically illustrated in FIG. 3H. Being protected by the patterned OPL 34', the gate metal 26 in the nFET region remains intact while that in the nFET region is selectively removed. The resulting pFET structure (s) 30P will accordingly include gaps 74 between each of the nanosheet channel layers 21. The gate dielectric layer 24 and the layer 24' of dielectric material on the substrate 22 remain essentially intact during gate metal removal. Gate metal chosen for the pFET region can be deposited later in the process. A portion of the gate metal layer 26' at the bottom of the nFET structure 30N extends laterally towards the n/p boundary.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, exemplary methods of removing gate metal from a region of nanosheet transistors includes obtaining a monolithic structure including first and second regions (nFET and pFET regions). The first region of the monolithic structure includes a first nanosheet transistor structure, for example an nFET nanosheet transistor structure 30N having nanosheet channel regions 21. The second region includes a second nanosheet transistor structure, for example a pFET transistor structure 30P, having nanosheet channel regions 21. A trench 31 between the first nanosheet transistor structure and the second nanosheet transistor structure extends over an n/p boundary between the first region and the second region of the monolithic structure. A layer 24, 24' of gate dielectric material extends between the first and second nanosheet transistor structures and across the trench 31. A layer 26, 26' of gate metal extends around the nanosheet channel regions 21 of the first and second nanosheet transistor structures and over the layer 24, 24' of gate dielectric material.

A dielectric spacer layer 32 is deposited over the monolithic structure. The dielectric spacer layer extends over the first and second nanosheet transistor structures and has a horizontal segment extending across a bottom surface of the trench 31. Exemplary monolithic structures having such spacer layers are illustrated in FIGS. 1A, 2A and 3A. At least a portion of the horizontal segment of the dielectric spacer layer 32 is removed, thereby exposing a portion of the layer of gate metal 26' between the first nanosheet transistor structure 30N and the second nanosheet transistor structure 30P. FIGS. 1C and 3E show exemplary structures after a portion of the spacer layer 32 over the n/p boundary is removed. A first etch of the layer of gate metal 26' is conducted, thereby causing removal of the exposed portion of the gate metal layer 26' between the first nanosheet transistor structure and the second nanosheet transistor structure. A portion of the layer of gate dielectric material is removed over the boundary between the first region and the second region of the monolithic structure. FIGS. 1D, 2C and 3F illustrate exemplary structures following partial removal of gate metal and gate dielectric material over the n/p boundary. A patterned buffer layer (34 or 34') as shown in FIGS. 1E, 2E and 3G is formed over the first region of the monolithic structure. (The spacer layer 32 may or may not be present at the time of formation of the patterned buffer layer.) The dielectric spacer layer 32 is removed from the second region of the monolithic structure. FIGS. 1F, 2G and 3F show exemplary structures wherein the portions of the spacer layer 32, the gate metal layer, and the layer of gate dielectric material have been removed from the bottom of the trench 31. The monolithic structure is subjected to a wet second etch, thereby removing the layer of gate metal 26, 26' from the second nanosheet transistor structure while the gate metal 26, 26' extending around the first nanosheet transistor 30N structure remains intact. FIGS. 1G, 2F and 3I illustrate exemplary monolithic structures 40, 60, 90, respectively, in which gate metal has been removed from the pFET region.

The first etch of the layer of gate metal causes partial undercutting of the layer of gate metal 26' beneath the dielectric spacer layer 32, though not directly beneath the nanosheet channel regions 21, in both the first region and the second region of the monolithic structure, as shown in FIGS. 1D, 2C and 3F. Cavities 31' between the spacer layer 32 and the layer of gate dielectric material 24' are formed during the first etch.

The methods according to one or more embodiments of the invention include forming a protective layer on a top surface of the dielectric spacer layer 32. The protective layer includes a first portion over the first nanosheet transistor structure 30N and a second portion over the second nanosheet transistor structure 30P. In one embodiment, forming the protective layer on the top surface of the dielectric spacer layer includes subjecting the dielectric spacer layer to angled ion implantation such that the horizontal segment of the dielectric spacer layer remains essentially unprotected by the protective layer. FIG. 1B schematically illustrates forming such a protective layer 32' prior to spacer RIE and the etching of gate metal and dielectric layers. The methods described herein can be applied to other types of field-effect transistors such as VTFETs where scaling may require relatively long etch processes for removing work function metal from regions of a substrate.

In a further embodiment, forming the protective layer on the top surface of the dielectric spacer layer includes subjecting the dielectric spacer layer to angled physical vapor deposition of a hard mask material 52 such that the horizontal segment of the dielectric spacer layer remains essentially unprotected by the protective layer. FIG. 2B schematically illustrates PVD deposition of hard mask material. In a further alternative embodiment exemplified in FIGS. 3B, 3C and 3D, forming the protective layer on the top surface of the dielectric spacer layer includes forming a protective coating 34 over the monolithic structure, removing portions of the protective coating, thereby exposing the top surface of the dielectric spacer layer 32, and forming the protective layer 72 on the top surface of the exposed dielectric spacer layer and directly over the transistor structures.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having, for example, nanosheet FET or VTFET devices formed in accordance with one or more of the exemplary embodiments.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (ME), which are all known techniques to remove select material when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A monolithic structure comprising:
   a substrate layer;
   a first region on the substrate layer and including a first nanosheet transistor structure, the first nanosheet transistor structure including nanosheet channel regions, a gate metal layer extending around the nanosheet channel regions, and a gate dielectric layer between the nanosheet channel regions and the gate metal layer;
   a second region on the substrate layer and including a second nanosheet transistor structure, the second nanosheet transistor structure including nanosheet channel regions and a gate dielectric layer adjoining the nanosheet channel regions;
   a trench between the first nanosheet transistor structure and the second nanosheet transistor structure, the trench extending over a boundary between the first region and the second region;
   the gate metal layer of the first nanosheet transistor structure further including vertical portions extending orthogonally with respect to the nanosheet channel regions and a horizontal bottom portion, the horizontal bottom portion of the gate metal layer including a first portion between the substrate layer and a bottom nanosheet channel region and a second portion extending laterally beyond one of the vertical portions of the gate metal layer in the direction of the boundary.

2. The monolithic structure of claim 1, further including:
   a layer of gate dielectric material on the substrate layer, the layer of gate dielectric material including a first segment beneath the first nanosheet transistor structure and extending laterally beyond the first nanosheet transistor structure in the direction of the boundary, the first segment further including an end portion terminating within the first region on a first side of the boundary; and
   a second segment of the layer of gate dielectric material beneath the second nanosheet transistor structure, the second segment of the layer of gate dielectric material extending laterally beyond the second nanosheet transistor structure in the direction of the boundary and having an end portion terminating within the second region on a second side of the boundary.

3. The monolithic structure of claim 2, further including a dielectric spacer layer over the first nanosheet transistor structure, the dielectric spacer layer including a bottom surface adjoining the horizontal bottom portion of the gate metal layer and extending laterally beyond the horizontal bottom portion of the gate metal layer in the direction of the boundary.

4. The monolithic structure of claim 2, further including a mask layer over the dielectric spacer layer and contacting a top surface of the substrate layer.

5. The monolithic structure of claim 4, wherein the gate metal layer comprises titanium nitride.

6. The monolithic structure of claim 1, wherein the first nanosheet transistor structure is configured as an n-type transistor.

7. The monolithic structure of claim 1, further including a mask layer over the first nanosheet transistor structure and contacting a top surface of the substrate layer.

* * * * *